United States Patent
Holalkere et al.

(10) Patent No.: US 7,115,987 B2
(45) Date of Patent: *Oct. 3, 2006

(54) INTEGRATED STACKED MICROCHANNEL HEAT EXCHANGER AND HEAT SPREADER

(75) Inventors: Ven R. Holalkere, Dublin, CA (US); Ravi Prasher, Tempe, AZ (US); Stephen Montgomery, Seattle, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/750,234

(22) Filed: Dec. 31, 2003

(65) Prior Publication Data

US 2005/0139992 A1  Jun. 30, 2005

(51) Int. Cl.
*H01L 23/34* (2006.01)
(52) U.S. Cl. ...................... 257/713; 257/719
(58) Field of Classification Search ............... 257/706, 257/707, 712, 719, 713; 438/117, 125
See application file for complete search history.

(56) References Cited

U.S. PATENT DOCUMENTS

| | | | |
|---|---|---|---|
| 4,759,874 A * | 7/1988 | Gros | 252/512 |
| 5,727,618 A * | 3/1998 | Mundinger et al. | 165/80.4 |
| 6,504,721 B1 | 1/2003 | Watwe et al. | |
| 6,565,386 B1 | 5/2003 | Yoneyama et al. | |
| 6,639,799 B1 | 10/2003 | Prasher et al. | |
| 6,661,660 B1 | 12/2003 | Prasher et al. | |
| 6,785,134 B1 | 8/2004 | Maveety et al. | |
| 6,821,819 B1 * | 11/2004 | Benavides et al. | 438/122 |
| 6,865,081 B1 * | 3/2005 | Meyer et al. | 361/699 |
| 6,903,929 B1 * | 6/2005 | Prasher et al. | 361/699 |
| 6,906,919 B1 | 6/2005 | Pokharna et al. | |
| 6,934,154 B1 * | 8/2005 | Prasher et al. | 361/699 |
| 6,981,849 B1 | 1/2006 | Kim et al. | |
| 6,992,381 B1 | 1/2006 | Kim et al. | |

(Continued)

OTHER PUBLICATIONS

Choi et al: Effects of Temperatures on Microstructures and Bonding Strenghts of Si-Si Bonding Using Bisbenzocyclobutene; Science Direct at www.sciencedirect.com; 2003; 5 pages.
Wei et al: Optimization Study of Stacked Micro-Channel Heat Sinks for Micro-Electronic Cooling; IEEE Transactions on Components and Packaging Technologies, vol. 26, No. 1, Mar. 2003; pp. 55-61.

(Continued)

*Primary Examiner*—T. N. Quach
(74) *Attorney, Agent, or Firm*—Robert D. Hinchliffe

(57) ABSTRACT

Integrated stacked microchannel heat exchanger and heat spreaders for cooling integrated circuit (IC) dies and packages and cooling systems employing the same are disclosed. In one embodiment, a stacked microchannel heat exchanger is operatively and thermally coupled to an IC die or package using an interstitial solder or a solderable material in combination with solder. In another embodiment, a stacked microchannel heat exchanger is operatively and thermally coupled to an IC die or package using an adhesive. In a further embodiment, a stacked microchannel heat exchanger is operatively coupled to an IC die or package by fasteners and is thermally coupled to the IC die or package using a thermal interface material. The integrated stacked microchannel heat exchanger and heat spreaders may be employed in a closed loop cooling system including a pump and a heat rejecter. The integrated stacked microchannel heat exchanger and heat spreaders are configured to support either a two-phase or a single-phase heat transfer process using a working fluid such as water.

30 Claims, 3 Drawing Sheets

U.S. PATENT DOCUMENTS

| | | |
|---|---|---|
| 6,992,382 B1 | 1/2006 | Chrysler et al. |
| 2004/0190253 A1 | 9/2004 | Prasher et al. |
| 2004/0266063 A1 | 12/2004 | Montgomery et al. |
| 2005/0122266 A1 | 6/2005 | Chang et al. |
| 2005/0128702 A1 | 6/2005 | Mongia et al. |
| 2005/0169831 A1 | 8/2005 | Montgomery et al. |

* cited by examiner

INTEGRATED STACKED MICROCHANNEL HEAT EXCHANGER AND HEAT SPREADER

BACKGROUND

Integrated circuits such as microprocessors generate heat when they operate and frequently this heat must be dissipated or removed from the integrated circuit die to prevent overheating. This is particularly true when the microprocessor is used in a notebook computer or other compact device where space is tightly constrained and more traditional die cooling techniques such as direct forced air cooling are impractical to implement.

One technique for cooling an integrated circuit die is to attach a fluid-filled microchannel heat exchanger to the die. A typical microchannel heat exchanger consists of a silicon substrate in which microchannels have been formed using a subtractive microfabrication process such as deep reactive ion etching or electro-discharge machining. Typical microchannels are rectangular in cross-section with widths of about 100 m and depths of between 100–300 m. Fundamentally the microchannels improve a heat exchanger s coefficient of heat transfer by increasing the conductive surface area in the heat exchanger. Heat conducted into the fluid filling the channels can be removed simply by withdrawing the heated fluid.

Typically, the microchannel heat exchanger is part of a closed loop cooling system that uses a pump to cycle a fluid such as water between the microchannel heat exchanger where the fluid absorbs heat from a microprocessor or other integrated circuit die and a remote heat sink where the fluid is cooled. Heat transfer between the microchannel walls and the fluid is greatly improved if sufficient heat is conducted into the fluid to cause it to vaporize. Such two-phase cooling enhances the efficiency of the microchannel heat exchanger because significant thermal energy above and beyond that which can be simply conducted into the fluid is consumed in overcoming the fluid s latent heat of vaporization. This latent heat is then expelled from the system when the fluid vapor condenses back to liquid form in the remote heat sink. Water is a particularly useful fluid to use in two-phase systems because it is cheap, has a high heat (or enthalpy) of vaporization and boils at a temperature that is well suited to cooling integrated circuits.

The heat removal capacity of microchannel heat exchangers can be enhanced by vertically stacking multiple layers of microchannel structures to form a stacked microchannel heat exchanger. Stacked microchannel heat exchangers are more efficient at removing heat from ICs because each additional layer of microchannels doubles the surface area for heat exchange per unit area of the heat exchanger.

Conventionally, heat exchangers are not physically coupled directly to an IC die or package but, rather, are coupled to a metallic heat spreader that is itself coupled to the IC die or package. In the context of mobile computing systems the size of a typical heat exchanger often precludes coupling the heat exchanger directly to the heat spreader thus requiring the addition of a heat pipe or other thermally conductive structure to provide the physical and thermal coupling between the heat exchanger and the heat spreader. Heat pipes or similar devices are bulky and occupy valuable space within a mobile computing system.

BRIEF DESCRIPTION OF THE DRAWINGS

The foregoing aspects of this invention will become more readily appreciated by reference to the following detailed description, when taken in conjunction with the accompanying drawings, wherein like reference numerals refer to like parts throughout the various views unless otherwise specified. In the drawings.

DETAILED DESCRIPTION

Figure 1:
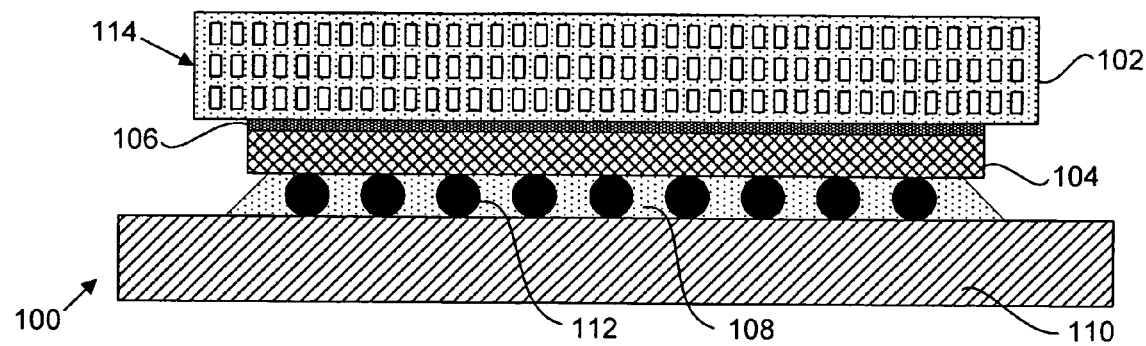
FIG. 1 is a cross-section view of an integrated stacked microchannel heat exchanger and spreader including a stacked microchannel heat exchanger coupled to an integrated circuit (IC) die by a layer of solder in accordance with an embodiment of the invention.

Embodiments of integrated stacked microchannel heat exchanger and spreader apparatus, cooling systems employing the same and methods for cooling electronic components using the same are described. In the following description, numerous specific details such as cooling apparatus and system implementations, types and interrelationships of cooling apparatus and system components, and particular embodiments of integrated stacked microchannel heat exchanger and spreaders are set forth in order to provide a more thorough understanding of the present invention. It will be appreciated, however, by one skilled in the art that embodiments of the invention may be practiced without such specific details or by utilizing, for example, different embodiments of integrated stacked microchannel heat exchanger and spreaders. In other instances, methods for manufacturing integrated stacked microchannel heat exchanger and spreaders or specific mechanical details for implementing cooling apparatus or systems, for example, have not been shown in detail in order not to obscure the embodiments of the invention. Those of ordinary skill in the art, with the included descriptions will be able to implement appropriate functionality without undue experimentation.

References in the specification to one embodiment, an embodiment, an example embodiment, etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Moreover, the particular features, structures, or characteristics may be combined in any suitable manner in one or more embodiments.

A number of figures show block diagrams of apparatus and systems comprising integrated stacked microchannel heat exchanger and spreaders, in accordance with embodiments of the invention. One or more figures show flow diagrams illustrating operations for making or using integrated stacked microchannel heat exchanger and spreaders likewise in accordance with embodiments of the invention. The operations of the flow diagrams will be described with references to the systems/apparatus shown in the block diagrams. However, it should be understood that the operations of the flow diagrams could be performed by embodiments of systems and apparatus other than those discussed with reference to the block diagrams, and embodiments discussed with reference to the systems/apparatus could perform operations different than those discussed with reference to the flow diagrams.

Integrated Stacked Microchannel Heat Exchanger and Heat Spreader

To provide effective heat removal, a stacked microchannel heat exchanger is coupled to an IC die or package using an intervening heat spreader to form an integrated heat exchanger and heat spreader. A variety of different types or forms of well-known heat spreaders can be used consistent with the invention, thus, while several embodiments of the invention are described in detail below, other types or forms of heat spreader may be used in combination with a stacked microchannel heat exchanger without departing from the scope or spirit of the invention.

FIG. 1 illustrates in cross-sectional view one embodiment of an integrated stacked microchannel heat exchanger and heat spreader 100 in accordance with the invention including a stacked microchannel heat exchanger 102 physically and thermally coupled to an IC die 104 by a layer of solder 106. An epoxy underfill 108 is typically employed to strengthen the interface between die 104 and the substrate 10 that die 104 is flip-bonded to by a plurality of solder bumps 112. While the embodiment of FIG. 1 illustrates die 104 flip-bonded by a plurality of solder bumps 112, other methods of bonding die 104 to substrate 110 may be used in combination with a stacked microchannel heat exchanger without departing from the scope or spirit of the invention.

Stacked microchannel heat exchanger 102 includes several vertically stacked layers of generally rectangular microchannels 114 having open ends and extending the length of heat exchanger 102. In FIG. 1 and the figures that follow the dimensions of microchannels 114 are exaggerated for clarity. The invention is not limited by the number of vertically stacked microchannel layers and the total number of microchannels in heat exchanger 102. The dimensions of microchannels 114, the number of vertically stacked microchannel layers and the total number of microchannels can vary depending on the cooling needs of die 104.

Heat exchanger 102 is one example of a stacked microchannel heat exchanger that may be formed using one of many well-known techniques common to industry practices. For example, single layers of microchannels 114 may be formed in thinned silicon wafers using techniques including but not limited to electro-discharge micromachining, chemical etching and laser ablation. The individual wafers of microchannel-bearing silicon may then be vertically stacked and bonded together to form stacked microchannel heat exchanger 102. In operation, heat exchanger 102 acts as a thermal mass to absorb heat conducted from the integrated circuits within die 104.

In one embodiment die 104 and microchannel heat exchanger 102 are silicon and solder 106 is an interstitial solder such as a low-melting point indium solder for example. In one embodiment solder 106 may initially comprise a solder preform having a pre-formed shape conducive to the particular configuration of the bonding surfaces. The solder preform is placed between the die 104 and heat exchanger 102 during a pre-assembly operation and then heated to a reflow temperature at which point the solder melts. The temperature of the solder and joined components are then lowered until the solder solidifies, thus forming a bond between the joined components.

Figure 2:
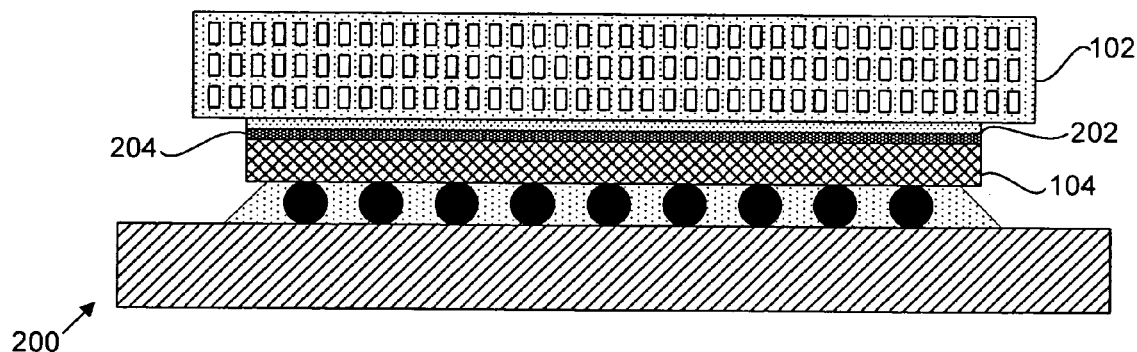
FIG. 2 is a cross-section view of an integrated stacked microchannel heat exchanger and heat spreader including a stacked microchannel heat exchanger coupled to an IC die by a layer of solder and a layer of solderable material in accordance with an embodiment of the invention.

FIG. 2 illustrates in cross-sectional view one embodiment of an integrated stacked microchannel heat exchanger and heat spreader 200 in accordance with the invention including a stacked microchannel heat exchanger 102 physically and thermally coupled to an IC die 104 by a layer of solder 202 and a layer of solderable material 204.

Generally, solderable material 204 may comprise any material to which the selected solder will bond. Such materials include but are not limited to metals such as copper (Cu), gold (Au), nickel (Ni), aluminum (Al), titanium (Ti), tantalum (Ta), silver (Ag) and Platinum (Pt). In one embodiment, in a process termed backside metallization, the layer of solderable material comprises a base metal over which another metal is formed as a top layer. In another embodiment, the solderable material comprises a noble metal; such materials resist oxidation at solder reflow temperatures, thereby improving the quality of the soldered joints.

Generally, the layer (or layers) of solderable material may be formed over the top surface of the die 104 using one of many well-known techniques common to industry practices. For example, such techniques include but are not limited to sputtering, vapor deposition (chemical and physical), and plating. The formation of the solderable material layer may occur prior to die fabrication (i.e., at the wafer level) or after die fabrication processes are performed. In one embodiment solder 202 may initially comprise a solder preform having a pre-formed shape conducive to the particular configuration of the bonding surfaces.

Figure 3:
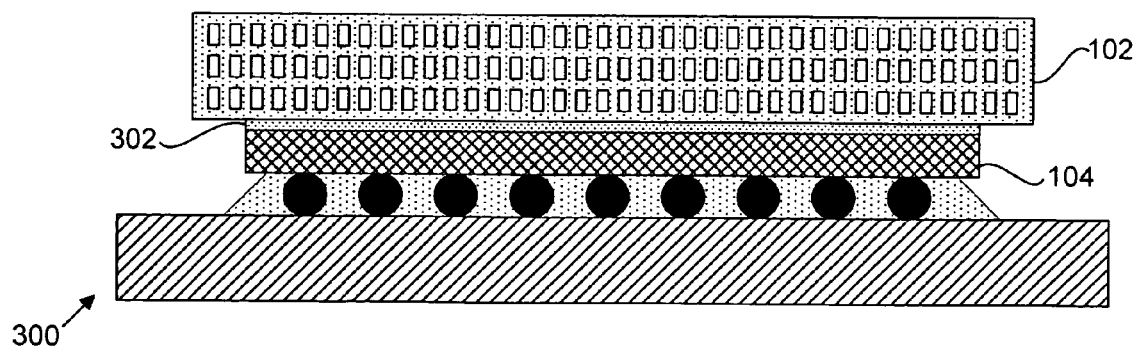
FIG. 3 is a cross-section view of an integrated stacked microchannel heat exchanger and heat spreader including a stacked microchannel heat exchanger coupled to an IC die by a layer of adhesive in accordance with an embodiment of the invention.

FIG. 3 illustrates in cross-sectional view one embodiment of an integrated stacked microchannel heat exchanger and heat spreader 300 in accordance with the invention including a stacked microchannel heat exchanger 102 physically and thermally coupled to an IC die 104 by a layer of adhesive 302. In one embodiment, heat exchanger 102 and die 104 are both formed from silicon and adhesive 302 is a silicon-to-silicon bonding adhesive such as bisbenzocyclobutene (BCB) for example. BCB and similar polymers provide good heat conduction, are mechanically strong and stable up to temperatures of 300 . . . C. In another embodiment, adhesive 302 is a thermal adhesive. Thermal adhesives, sometimes called thermal epoxies, are a class of adhesives that provide good to excellent conductive heat transfer rates. Typically, a thermal adhesive will employ fine portions (e.g., granules, slivers, flakes, micronized, etc.) of a metal or ceramic, such as silver or alumina, distributed within in a carrier (the adhesive), such as epoxy.

A further consideration related to the embodiment of FIG. 3 is that the stacked microchannel heat exchanger need not comprise a metal. In general, stacked microchannel heat exchanger 102 may be made of any material that provides good conductive heat transfer properties. For example, a ceramic carrier material embedded with metallic pieces in a manner similar to the thermal adhesives discussed above may be employed for the stacked microchannel heat exchanger 102. It is additionally noted that a heat exchanger of similar properties may be employed in the embodiment of FIG. 2 if another layer of solderable material is formed over the base of the stacked microchannel heat exchanger 102.

Figure 4:
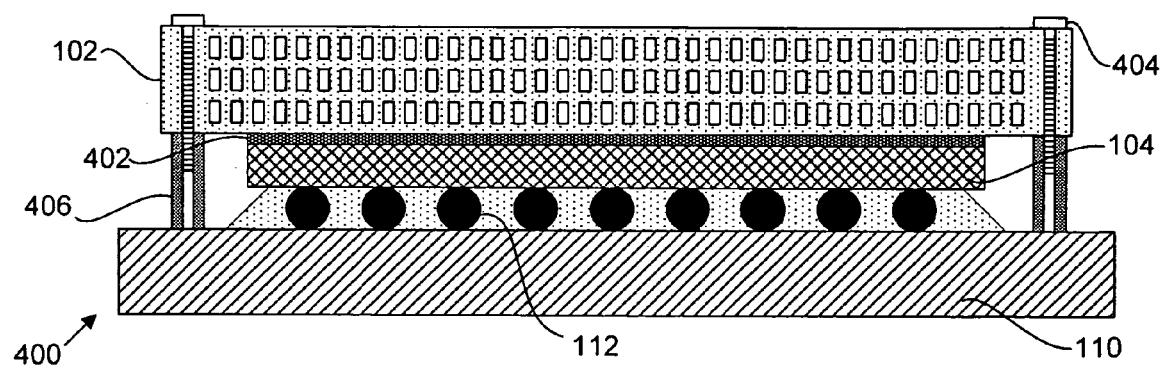
FIG. 4 is a cross-section view of an integrated stacked microchannel heat exchanger and heat spreader including a stacked microchannel heat exchanger coupled to an IC die using a thermal interface material and fasteners in accordance with an embodiment of the invention.

FIG. 4 illustrates, in accordance with an embodiment of the invention, an integrated stacked microchannel heat exchanger and heat spreader 400 comprising stacked microchannel heat exchanger 102 coupled thermally to an integrated circuit (IC) die 104 via a Thermal Interface Material (TIM) 402 and coupled operatively to substrate 110 to which the IC die 104 is flip-bonded by a plurality of solder bumps 112. TIM layer 402 serves several purposes; first, it provides a conductive heat transfer path from die 104 to heat exchanger 102 and, second, because TIM layer 402 is very compliant and adheres well to both the die 104 and heat exchanger 102, it acts as a flexible buffer to accommodate physical stress resulting from differences in the coefficients of thermal expansion (CTE) between die 104 and heat exchanger 102.

Stacked microchannel heat exchanger 102 of integrated stacked microchannel heat exchanger and heat spreader 400 is physically coupled to substrate 108 through a plurality of fasteners 404 each one of the plurality of fasteners 404 coupled to a respective one of a plurality of standoffs 406 mounted on substrate 110. The illustrated fasteners 404 and standoffs 406 are just one example of a number of well known assembly techniques that can be used to physically couple heat exchanger 102 to die 104. In another embodiment, for example, heat exchanger 102 is coupled to die 104 using clips mounted on substrate 110 and extending over heat exchanger 102 in order to press heat exchanger 102 against TIM layer 402 and die 104.

While FIGS. 1 thru 4 illustrate stacked microchannel heat exchanger 102 thermally and operatively coupled to IC die 104, the invention is not limited in this respect and one of ordinary skill in the art will appreciate that stacked heat exchanger 102 can be thermally and operatively coupled to an IC package containing one or more IC die to form integrated stacked microchannel heat exchanger and heat spreaders while remaining within the scope and spirit of the invention.

Cooling Systems

Figure 5:
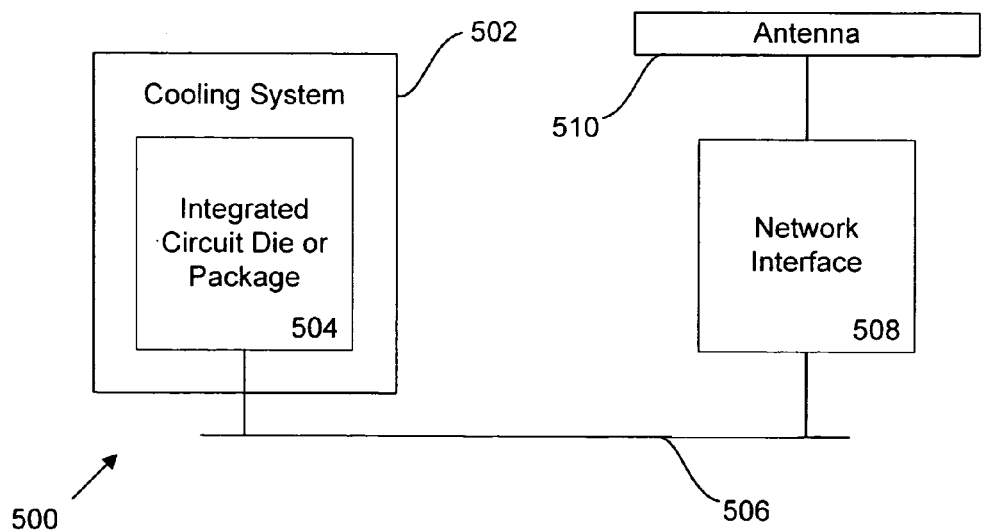
FIG. 5 is a block diagram of a mobile computer system employing a closed loop two-phase cooling system including an integrated stacked microchannel heat exchanger and heat spreader in accordance with an embodiment of the invention.

FIG. 5 illustrates one embodiment in accordance with the invention of a mobile computer system 500 having a closed loop two-phase cooling system 502 including an integrated stacked microchannel heat exchanger and spreader (not shown) coupled thermally and operatively to an integrated circuit (IC) die or package 504. System 500 includes a bus 506, which in an embodiment, may be a Peripheral Component Interface (PCI) bus, linking die or package 504 to a network interface 508 and an antenna 510. Network interface 508 provides an interface between IC die 504 and communications entering or leaving system 500 via antenna 510. The stacked microchannel heat exchanger within cooling system 502 acts as a thermal mass to absorb thermal energy from, and thereby cool, die or package 504. Cooling system 502 is described in more detail below with respect to FIG. 6. While the embodiment of system 500 is a mobile computer system, the invention is not limited in this respect and other embodiments of systems incorporating cooling systems utilizing integrated stacked microchannel heat exchanger and spreaders in accordance with the invention include, for example, desktop computer systems, server computer systems and computer gaming consoles to name only a few possibilities.

Figure 6:
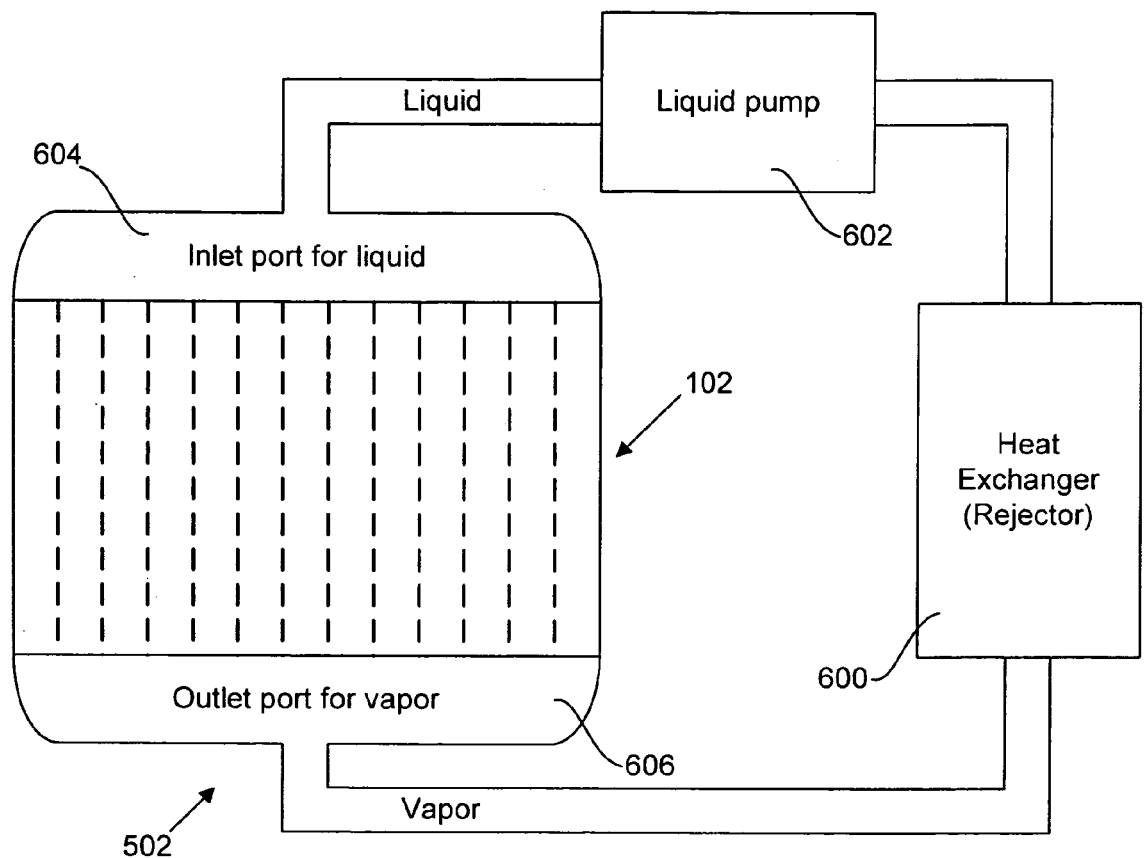
FIG. 6 is a schematic diagram of a closed loop cooling system employing an integrated stacked microchannel heat exchanger and heat spreader in accordance with an embodiment of the invention.

FIG. 6 illustrates one embodiment in accordance with the invention of closed loop two-phase cooling system 502 having a stacked microchannel heat exchanger 102 coupled thermally and operatively to an integrated circuit (IC) die (not shown). System 502 further includes a heat rejecter 600 and a pump 602. System 502 takes advantage of the fact, as discussed earlier, that a fluid undergoing a phase transition from a liquid state to a vapor state absorbs a significant amount of energy, known as latent heat, or heat of vaporization. This absorbed heat having been converted into potential energy in the form of the fluid s vapor state can be subsequently removed from the fluid by returning the vapor phase back to liquid. The stacked microchannels, which typically have hydraulic diameters on the order of hundred-micrometers, are very effective for facilitating the phase transfer from liquid to vapor.

System 502 functions as follows. As the die circuitry generates heat, the heat is conducted into stacked microchannel heat exchanger 102. The heat increases the temperature of the thermal mass represented by heat exchanger 102, thereby heating the temperature of the walls in the stacked microchannels. Liquid is pushed by pump 602 into an inlet port 604, where it enters the inlet ends of the stacked microchannels. As the liquid passes through the stacked microchannels, further heat transfer takes place between the microchannel walls and the liquid. Under a properly configured heat exchanger, a portion of the fluid exits the stacked microchannels as vapor at an outlet port 606. The vapor then enters heat rejecter 600. The heat rejecter comprises a second heat exchanger that performs the reverse phase transformation as stacked microchannel heat exchanger 102—that is, it converts the vapor entering at an inlet end back to a liquid at the outlet of the heat rejecter. The liquid is then received at an inlet side of pump 602, thus completing the cooling cycle.

Generally, the pump 602 used in the closed loop cooling system 502 employing integrated stacked microchannel heat exchanger and heat spreaders in accordance with the embodiments described herein may comprise electromechanical (e.g., MEMS-based) or electro-osmotic pumps (also referred to as "electric kinetic" or "E-K" pumps). Electro-osmotic pumps are advantageous over electromechanical pumps because they do not have any moving parts and hence are more reliable than electromechanical pumps. Since both of these pump technologies are known in the microfluidic arts, further details are not provided herein.

In this manner system 502 acts to transfer the heat rejection process from the IC die or package, which, for example, is typically somewhat centrally located within the chassis of a notebook computer to the location of the heat rejecter heat exchanger, which can be located anywhere within the chassis, or even externally.

Figure 7:
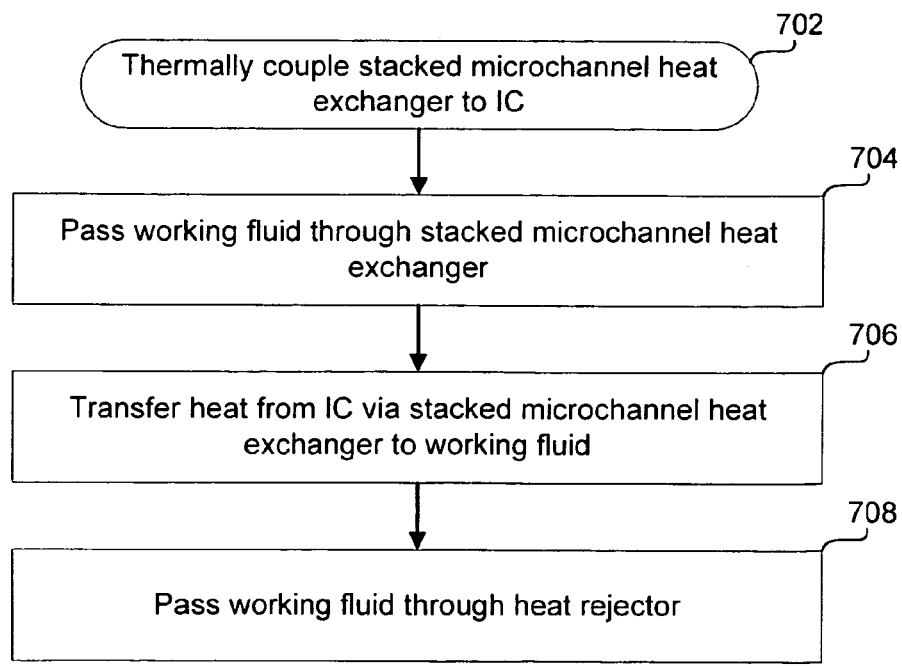
FIG. 7 is a flow diagram representing implementation of a method for cooling ICs using an integrated stacked microchannel heat exchanger and heat spreader in accordance with an embodiment of the invention.

FIG. 7 illustrates a flow diagram representing implementation of a method for cooling ICs using an integrated stacked microchannel heat exchanger and heat spreader in accordance with an embodiment of the invention. In the embodiment of FIG. 7 the ICs being cooled include a processor IC and can include additional components such as platform chipset ICs, memory ICs, video ICs, co-processors or other ICs. Some or all of the additional ICs can be spatially separated from the processor IC or can be included in an IC package along with processor IC. In block 702, at least one stacked microchannel heat exchanger such as heat exchanger 102 is thermally coupled to a least one IC. In block 704, a working fluid such as water is passed through the stacked microchannel heat exchanger. At block 706, heat is transferred from the IC into working fluid within the stacked microchannel heat exchanger thereby converting a portion of the working fluid from liquid to vapor phase. Finally, at block 708, the working fluid exiting the stacked microchannel heat exchanger is passed through a heat rejector where heat is removed from the working fluid converting the working fluid back to a liquid phase.

Thus, methods, apparatuses and systems of integrated stacked microchannel heat exchanger and heat spreaders have been described. Although the invention has been described with reference to specific exemplary embodiments, it will be evident that various modifications and changes may be made to these embodiments without departing from the broader spirit and scope of the invention. For example, while the method, apparatuses and systems for utilizing integrated stacked microchannel heat exchanger and heat spreaders are described in reference to the invention s use in a two-phase liquid cooling system, in other embodiments, such method and systems are applicable to use in a single-phase cooling system. Therefore, the specification and drawings are to be regarded in an illustrative rather than a restrictive sense.

What is claimed is:

1. An apparatus comprising:
    an integrated circuit (IC) die; and
    a thermal mass coupled to the IC die, wherein the thermal mass comprises a heat exchanger including a plurality of microchannel layers.
2. The apparatus of claim 1, wherein the thermal mass is thermally and operatively coupled to the IC die by a layer of solder disposed between the thermal mass and the surface of the IC die.
3. The apparatus of claim 2, wherein the layer of solder comprises interstitial solder.
4. The apparatus of claim 1, wherein the thermal mass is thermally and operatively coupled to the IC die by an adhesive disposed between the thermal mass and the surface of the IC die.
5. The apparatus of claim 4, wherein the adhesive comprises a thermal adhesive.
6. The apparatus of claim 4, wherein the adhesive comprises a silicon to silicon bonding adhesive.
7. The apparatus of claim 6, wherein the adhesive comprises a polymer compound.
8. The apparatus of claim 7, wherein the adhesive comprises bisbenzocyclobutene.
9. The apparatus of claim 1, wherein the thermal mass is thermally coupled to the IC die by a thermal interface material (TIM) layer.
10. The apparatus of claim 1, further comprising a substrate to which the IC die is flip-bonded.
11. The apparatus of claim 10, wherein the thermal mass is operatively coupled to the substrate via a plurality of fasteners.
12. The apparatus of claim 11, further comprising a plurality of standoffs physically coupled to the substrate and to which the plurality of fasteners are physically coupled.
13. The apparatus of claim 1, further comprising:
    a solderable layer formed on the IC die; wherein the thermal mass is thermally and operatively coupled to IC die by the solderable layer.
14. The apparatus of claim 13, wherein the solderable layer is formed from at least one of the following metals: copper (Cu), gold (Au), nickel (Ni), aluminum (Al), titanium (Ti), tantalum (Ta), silver (Ag) and Platinum (Pt).
15. The apparatus of claim 13, wherein the solderable layer and the thermal mass are made of substantially similar metals.
16. An apparatus comprising:
    an integrated circuit (IC) package, said IC package containing one or more IC dies; and
    a thermal mass coupled to the IC package, wherein the thermal mass comprises a heat exchanger including a plurality of microchannel layers.
17. The apparatus of claim 16, wherein the thermal mass is thermally and operatively coupled to the IC die by a layer of solder disposed between the thermal mass and the surface of the IC die.
18. The apparatus of claim 17, wherein the layer of solder comprises interstitial solder.
19. The apparatus of claim 16, wherein the thermal mass is thermally and operatively coupled to the IC die by an adhesive disposed between the thermal mass and the surface of the IC die.
20. The apparatus of claim 19, wherein the adhesive comprises a thermal adhesive.
21. The apparatus of claim 19, wherein the adhesive comprises a silicon to silicon bonding adhesive.
22. The apparatus of claim 21, wherein the adhesive comprises a polymer compound.
23. The apparatus of claim 22, wherein the adhesive comprises bisbenzocyclobutene.
24. The apparatus of claim 16, wherein the thermal mass is thermally coupled to the IC die by a thermal interface material (TIM) layer.
25. The apparatus of claim 16, further comprising a substrate to which the IC die is flip-bonded.
26. The apparatus of claim 25, wherein the thermal mass is operatively coupled to the substrate via a plurality of fasteners.
27. The apparatus of claim 26, further comprising a plurality of standoffs physically coupled to the substrate and to which the plurality of fasteners are physically coupled.
28. The apparatus of claim 16, further comprising:
    a solderable layer formed on the IC die; wherein the thermal mass is thermally and operatively coupled to IC die by the solderable layer.
29. The apparatus of claim 28, wherein the solderable layer is formed from at least one of the following metals: copper (Cu), gold (Au), nickel (Ni), aluminum (Al), titanium (Ti), tantalum (Ta), silver (Ag) and Platinum (Pt).
30. The apparatus of claim 28, wherein the solderable layer and the thermal mass are made of substantially similar metals.

* * * * *